(12) United States Patent
Jaskela

(10) Patent No.: US 9,136,621 B1
(45) Date of Patent: Sep. 15, 2015

(54) GUIDES AND TAB ARRANGEMENT TO RETAIN A CARD HAVING AN EDGE CONNECTOR AND METHOD OF USE

(75) Inventor: Wayde C. Jaskela, Windsor, CA (US)

(73) Assignee: Ciena Corporation, Hanover, MD (US)

( * ) Notice: Subject to any disclaimer, the term of this patent is extended or adjusted under 35 U.S.C. 154(b) by 279 days.

(21) Appl. No.: 13/585,796

(22) Filed: Aug. 14, 2012

(51) Int. Cl.
| | |
|---|---|
| H01R 12/70 | (2011.01) |
| H05K 5/00 | (2006.01) |
| H01R 12/72 | (2011.01) |
| H01R 13/627 | (2006.01) |
| G06F 1/18 | (2006.01) |
| G06K 13/08 | (2006.01) |

(52) U.S. Cl.
CPC ............ *H01R 12/7023* (2013.01); *G06F 1/185* (2013.01); *G06F 1/186* (2013.01); *G06K 13/08* (2013.01); *H01R 12/7005* (2013.01); *H01R 12/7029* (2013.01); *H01R 12/722* (2013.01); *H01R 13/6271* (2013.01); *H05K 5/0069* (2013.01)

(58) Field of Classification Search
CPC ............ H01R 12/7023; H01R 12/722; H01R 13/6271; H01R 12/7029; H01R 12/7005; H05K 5/0069; G06F 1/185; G06F 1/186; G06K 13/08
USPC ......... 361/679.58, 759, 679.32; 439/327, 328
See application file for complete search history.

(56) References Cited

U.S. PATENT DOCUMENTS

| | | | | |
|---|---|---|---|---|
| 3,954,242 | A | * | 5/1976 | Yoda ........................ 248/222.12 |
| 4,840,570 | A | * | 6/1989 | Mann et al. ..................... 439/74 |
| 4,938,701 | A | * | 7/1990 | Heberling ........................ 439/65 |
| 5,139,435 | A | * | 8/1992 | Komatsu et al. ............... 439/159 |
| 5,268,820 | A | * | 12/1993 | Tseng et al. ................... 361/785 |
| 5,286,207 | A | * | 2/1994 | McHugh .......................... 439/64 |
| 5,318,212 | A | * | 6/1994 | Becker et al. ................ 228/44.7 |
| 5,494,451 | A | * | 2/1996 | Bowers ........................ 439/328 |
| 5,980,273 | A | * | 11/1999 | Yong et al. ...................... 439/79 |
| 6,077,093 | A | * | 6/2000 | Seong et al. ..................... 439/79 |
| 6,089,905 | A | * | 7/2000 | Shimmyo et al. ............. 439/495 |
| 6,135,797 | A | * | 10/2000 | McCleerey et al. ........... 439/248 |
| 6,655,973 | B2 | * | 12/2003 | Ji et al. .......................... 439/159 |
| 6,655,976 | B1 | * | 12/2003 | Shipe et al. ................... 439/328 |

(Continued)

OTHER PUBLICATIONS

Form Factor Standard JEDEC MO-297A, available for download at www.jedec.orp, May 2009, 6 pages.

(Continued)

*Primary Examiner* — Terrell McKinnon
*Assistant Examiner* — Eret McNichols
(74) *Attorney, Agent, or Firm* — Omkar K. Suryadevara; Silicon Valley Patent Group LLP

(57) ABSTRACT

An arrangement has guides that define passageways for left and right edges of a card, and a tab located in a path of a connector at a front edge of the card. The tab is elastically deformable out of the path by movement of the connector, as the card is inserted into the arrangement. The tab returns to a space behind the connector when the connector moves past a highest point on the tab. The highest point is located between two surfaces of the tab: a ramp-up surface and a ramp-down surface. During movement along the path, the connector slides on the ramp-up surface to elastically deform the tab out of the path, and on further movement the ramp-down surface pushes on the connector as the connector mates with another external connector. Thereafter, presence of the tab keeps the two connectors mated, until the module is removed from the arrangement.

17 Claims, 14 Drawing Sheets

(56) References Cited

U.S. PATENT DOCUMENTS

| | | | |
|---|---|---|---|
| 6,712,632 B2* | 3/2004 | Wu | 439/328 |
| 6,767,235 B2* | 7/2004 | Wu | 439/328 |
| 6,967,848 B2* | 11/2005 | Klatt et al. | 361/759 |
| 6,971,900 B2* | 12/2005 | Liebenow | 439/327 |
| 7,053,471 B2* | 5/2006 | Wada et al. | 257/679 |
| 7,070,451 B2* | 7/2006 | Nagata | 439/630 |
| 7,121,862 B2 | 10/2006 | Tang et al. | |
| 7,239,529 B1* | 7/2007 | Chang | 361/809 |
| 7,321,490 B2* | 1/2008 | Wu | 361/679.48 |
| 7,420,813 B2* | 9/2008 | Yang | 361/732 |
| 7,467,963 B2* | 12/2008 | Chen | 439/328 |
| 7,510,424 B2* | 3/2009 | Mundt | 439/492 |
| 7,726,983 B2* | 6/2010 | Zhu | 439/79 |
| 8,018,729 B2* | 9/2011 | Skinner | 361/760 |
| 8,083,536 B2 | 12/2011 | Leach | |
| 8,248,818 B2* | 8/2012 | Kuo et al. | 361/802 |
| 8,292,648 B2* | 10/2012 | Kiryu et al. | 439/328 |
| 8,337,230 B1* | 12/2012 | Kurachi | 439/328 |
| 8,585,425 B2* | 11/2013 | Yeh | 439/327 |
| 8,613,414 B2* | 12/2013 | Rosemann et al. | 248/222.11 |
| 8,651,888 B2* | 2/2014 | Kurachi | 439/358 |
| 8,699,217 B2* | 4/2014 | Zhou | 361/679.31 |
| 2004/0018766 A1* | 1/2004 | Wu | 439/327 |
| 2005/0186824 A1* | 8/2005 | Liebenow | 439/327 |
| 2007/0127225 A1* | 6/2007 | Slaton | 361/807 |
| 2008/0137311 A1* | 6/2008 | Yang | 361/732 |
| 2009/0231798 A1* | 9/2009 | Skinner | 361/679.31 |
| 2009/0310299 A1* | 12/2009 | Liu | 361/679.58 |
| 2010/0188828 A1* | 7/2010 | Takao | 361/759 |
| 2010/0221938 A1* | 9/2010 | Liu | 439/152 |
| 2011/0128710 A1* | 6/2011 | Kuo et al. | 361/759 |
| 2012/0064753 A1* | 3/2012 | Qiao | 439/345 |
| 2012/0236521 A1* | 9/2012 | Tamura | 361/756 |
| 2013/0040483 A1* | 2/2013 | Ngo et al. | 439/328 |
| 2013/0058054 A1* | 3/2013 | Zhou | 361/748 |
| 2014/0002981 A1* | 1/2014 | Hoang | 361/679.32 |
| 2014/0211403 A1* | 7/2014 | Ma et al. | 361/679.32 |

OTHER PUBLICATIONS

Drawing of Compact Flash Card Connector, printed from http://php2.twinner.com.tw/files/kingfont/K-CFC1-06-C.pdf, Feb. 2005, 1 page.

Pictures of Compact Flash Card Connector, believed to be prior to Aug. 14, 2012, 3 pages.

Viking Element Industrial SSD Datasheet, Slim SATA, 2010, 41 pages.

"Serial ATA International Organization: Serial ATA Revision 2.6", http://read.pudn.com/downloads157/doc/project/697017/SerialATA_Revision_2_6_Gold.pdf, Feb. 2007, Chapter 6, pp. 1-24.

* cited by examiner

GUIDES AND TAB ARRANGEMENT TO RETAIN A CARD HAVING AN EDGE CONNECTOR AND METHOD OF USE

BACKGROUND

It is well known in the prior art to provide a printed circuit board (sometimes called "mother board") with one or more connector(s) (called "edge" connectors) for use in connecting thereto, additional printed circuit boards (called "cards") that support thereon various circuitry (e.g. flash memory). One such prior art module 20 as illustrated in FIG. 1 includes a card 22 with a connector 21 located at a front edge 22F. Card 22 in FIG. 1 has a thickness of Zcard and has mounted thereon one or more electronic components, such as an integrated circuit chip 23. Chip 23 is typically mounted on card 22 between connector 21 and a back edge 22K on either a bottom surface 22B or a top surface 22T of card 22. In addition to edges 22F and 22K described above, card 22 has a left edge 22L and a right edge 22R that are separated from one another in the X direction by a distance Xcard, which forms the width of module 20. Bottom surface 22B of card 22 is separated in the Z direction from bottom surface 21B of connector 21 by a distance Zconnector. Card 22 may be used with a mother board (not shown) by moving it in the Y direction until connector 21 mates with a corresponding connector (not shown) on the mother board.

One prior art example of module 20 is a memory module shown in FIGS. 1B-1D that includes flash memory (e.g. 25 GB) in the form of integrated circuit 23 (FIG. 1C) which forms a solid state drive or any other non-volatile memory mounted on a printed circuit board 22 in a component area 34 (FIG. 1B). The memory is electrically connected by traces of conductive material (not shown) to an interface connector 21 (FIG. 1C) in the connector area 32 (FIG. 1B). Connector 21 includes a first group of traces 21P (e.g. fifteen traces) that carry power signals (also called "power group") which are physically spaced apart from a second group of traces 21D (e.g. seven traces) that carry data signals (also called "data group"). Module 20 may conform to, for example, the Form Factor Standard "JEDEC MO-297A" which is available for download at www.jedec.org. Hence, module 20 has a width D1 of 54 mm, length D2 of 39.82 mm and thickness D6 of 4 mm as shown in FIGS. 1B-1D. Module 20 includes a connector 21 that conforms to SATA, which is a specification entitled "Serial ATA International Organization: Serial ATA Revision 2.6" available for downloaded on the Internet at www.sata-io.org. SATA Working Group is an organization set up by a number of companies such as APT Technologies Inc, Dell Computer Corporation, International Business Machines, Intel Corporation, Maxtor Corporation, Quantum Corporation, and Seagate Technology.

It is known in the prior art to provide a hook in a host connector on a mother board. Such a prior art hook on the mother board is typically used with a push button ejector. However, multiple parts (such as a hook and an ejector) that move relative to one another result in mechanical failures. Accordingly, the inventor of the current patent application believes there is a need for improvements of the type described below.

SUMMARY

Several embodiments in accordance with the invention use a structure or an arrangement that includes left and right guides that define passageways for left and right edges respectively of a card. The structure or arrangement further includes a tab that is located in a path through the arrangement or structure, of a connector at a front edge of the card. The tab is elastically deformable out of the path by movement of the connector, as the left and right edges of the card slide along the left and right guides. In some embodiments, the tab returns to a space behind the connector when the connector moves along the path past a highest point on the tab. The highest point in such embodiments is located between two surfaces of the tab: a ramp-up surface and a ramp-down surface. During movement along the path, the connector slides on the ramp-up surface to elastically deform the tab out of the path. On further movement of the connector along the path, the ramp-down surface pushes on the connector as the connector on the card mates with an external connector. Thereafter, presence of at least a portion of the tab in a space behind the connector keeps the two connectors mated to one another, until the module is deliberately removed from the arrangement or structure, by reverse movement along the path.

DETAILED DESCRIPTION

Figure 1A:
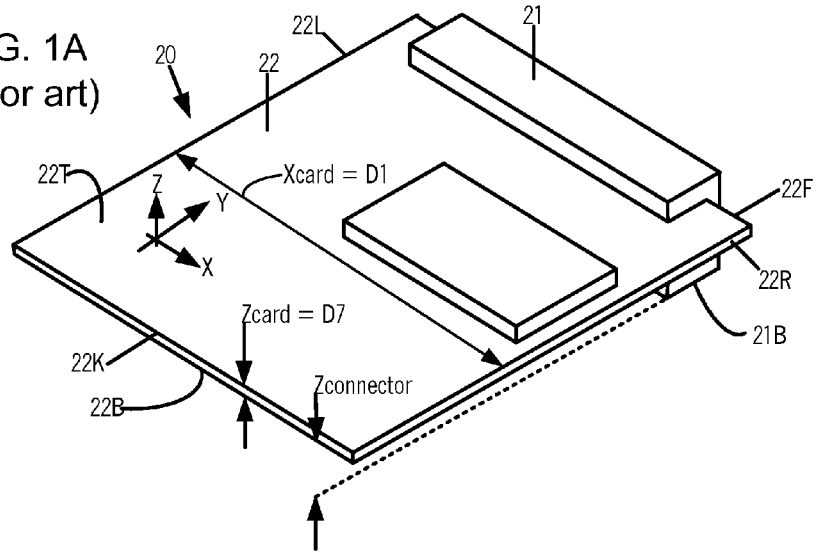
FIG. 1A illustrates, in a perspective view, a prior art module 20 that includes a card 22 with a connector 21 at a front edge 22F.

Several embodiments in accordance with the invention use an arrangement 299 (see FIG. 2A) of a tab 110 relative to two guides 120L and 120R, with guides 120L and 120R being separated from one another by a space and oriented substantially parallel to one another (e.g. less than 1° angle relative to one another). Left guide 120L (FIG. 2A) has a left bottom surface 121LB, a left side surface 121 LS and a left top surface 121LT (FIG. 2B) that are arranged to form a "U" shaped channel to accommodate a left edge of a card in a module, such as card 22 in module 20 in FIG. 1A. Similarly, right guide 120R (FIG. 2A) has a right bottom surface 121RB, a right side surface 121RS (FIG. 2A), and a right top surface 121RT (not labeled in FIG. 2A for clarity, please see FIG. 4E) that are also arranged to form another "U" shaped channel, to accommodate a right edge of the card. Hence the three surfaces 121LS, 121LB and 121LT of left guide 120L and the three surfaces 121RS, 121RB and 121RT of right guide 120R form a left passageway 129L (FIG. 2B) and a right passageway respectively, for left edge 22L (FIG. 1A) and right edge 22R of card 22 in module 20.

In some embodiments, the left side surface 121 LS and the right side surface 121RS are separated from one another by a distance Xpassage (FIG. 2A) that exceeds a width Xcard of card 22 by the distance Xclearance. Depending on the embodiment, the distance Xclearance may be predetermined to be sufficiently large to enable left edge 22L and right edge 22R of card 22 (FIG. 1A) to move along the left and right passageways respectively in guides 120L and 12R (FIG. 2A).

Figure 2A:
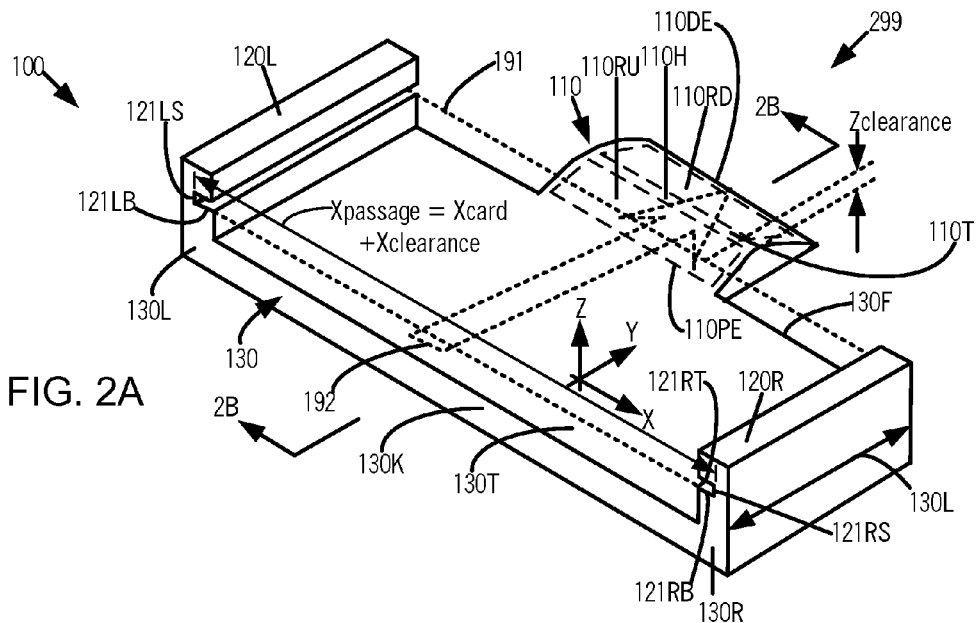
FIG. 2A illustrates, in a perspective view, a structure 100 which implements an arrangement to hold a card between left and right guides 120L and 120R, and a tab 110 located therebetween to retain a connector mounted on the card, in certain illustrative embodiments in accordance with the invention.
Figure 2B:
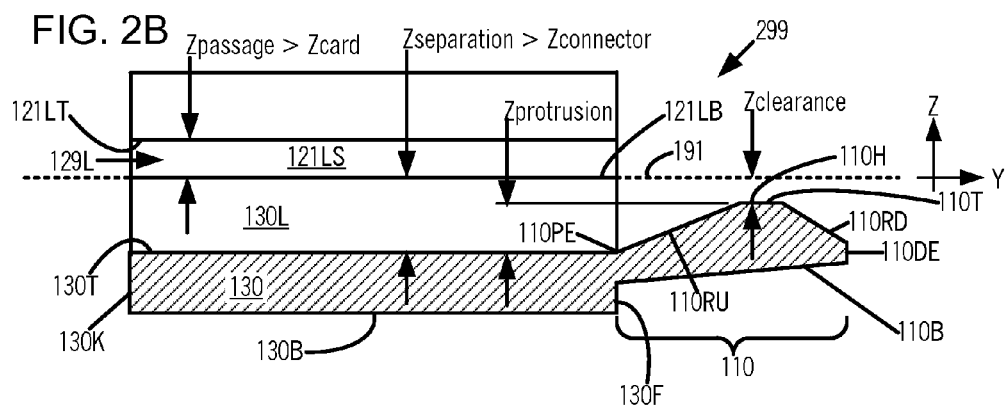
FIG. 2B illustrates a cross-sectional view of implementation of the arrangement of FIG. 2A in a structure 100, along direction 2B-2B of FIG. 2A.

In most embodiments, the arrangement 299 of FIG. 2A includes, in addition to the two guides 120L and 120R described above, at least one tab 110 that is elastically deformable and positioned in a space between the two guides 120L and 120R. Tab 110 is positioned such that a highest point 110H (FIG. 2A) on a top surface 110T of tab 110 is located in a direction transverse to and at a distance Zclearance (FIG. 2B) from a plane 191 that extends between guides 120L and 120R. In FIGS. 2A and 2B, X-axis and Y-axis of a coordinate system define a plane 191 with the highest point 110H of tab 110 located at the distance Zclearance along negative Z-axis.

In some embodiments, plane 191 is made co-extensive with a left bottom surface 121 LB and right bottom surface 121 RB, as illustrated in FIGS. 2A and 2B. Tab 110 is elastically deformable such that its highest point 110H moves from distance Zclearance described above to a new distance Zclearance+Zdeflection from plane 191. In summary, tab 110 (FIG. 2A) is resiliently deformable, out of a path 192 through the arrangement 299, by movement of connector 22 (FIG. 1A) as edges 22L and 22R of card 22 move along pathways defined by guides 120L and 120R respectively.

Depending on the embodiment, distance Zclearance+Zdeflection may be predetermined to be sufficiently large to enable a connector 21 (FIG. 1A) mounted on card 22 at a front edge 22F (FIG. 1A) to move along path 192 (FIG. 2A) when tab 110 is elastically deformed by distance Zdeflection. During elastic deformation of some embodiments, tab 110 pivots about a proximal end 110PE that is located closest to guides 120L and 120R. Proximal end 110PE of tab 110 does not move during elastic deformation, during movement of tab 110's highest point 110H through distance Zdeflection. Instead, in several such embodiments, tab 110 has another end, namely distal end 110DE that is located farthest from guides 120L and 120R, and it is this distal end 110DE that moves through a large distance Zmax (see FIG. 2C) during elastic deformation of tab 110. In several embodiments of tab 110, distal end movement Zmax>Zdeflection of highest point 110H.

Figure 2C:
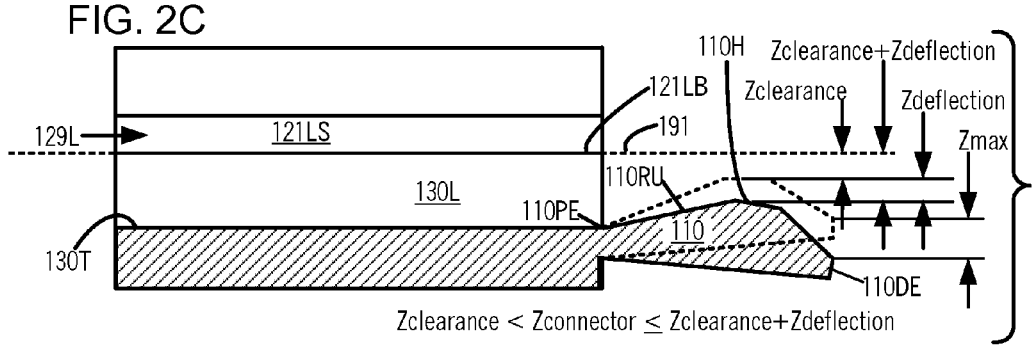
FIG. 2C illustrates structure 100 of FIGS. 2A and 2B with tab 110 shown deflected, relative to a normal position shown by dashed lines.
Figure 6A:
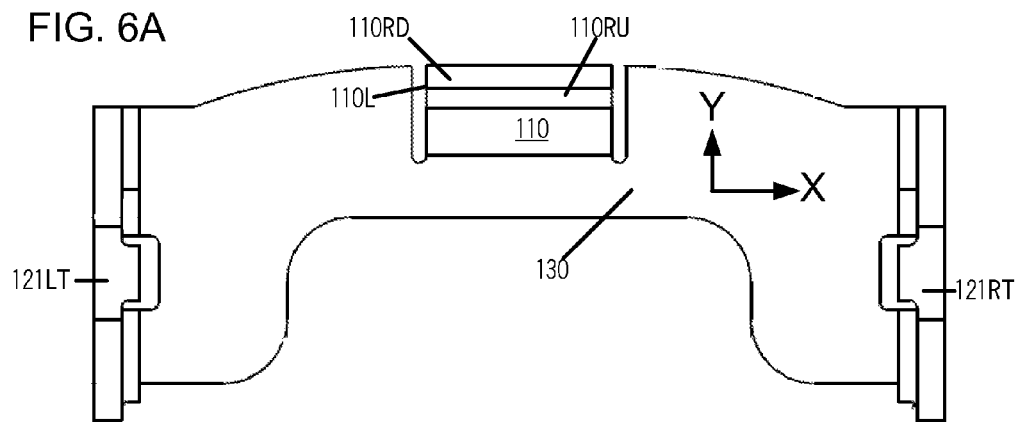
FIGS. 6A, 6B and 6C illustrate, in a top plan view, an elevation view, and a side view, the structure 100 of FIGS. 5A and 5B, in certain illustrative embodiments in accordance with the invention.
Figure 6B:
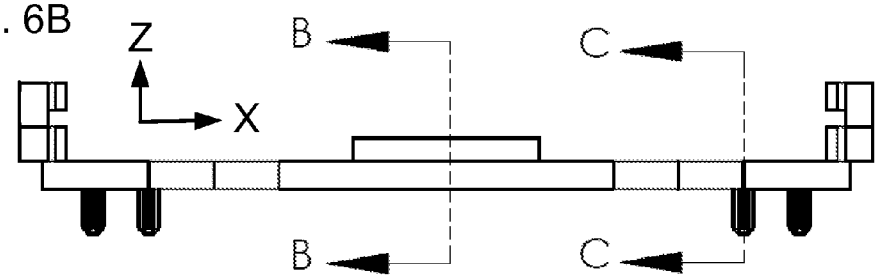
Figure 6C:
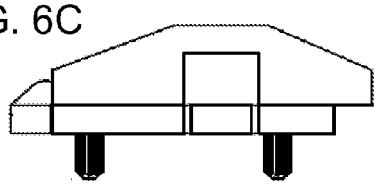
Figure 6D:
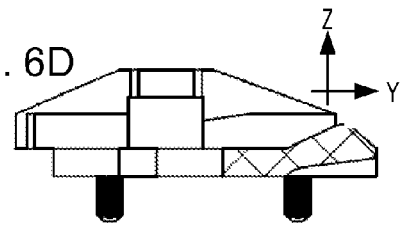
FIGS. 6D and 6E illustrate, in cross-sectional views along the directions B-B and C-C in FIG. 6B, some illustrative embodiments in accordance with the invention.
Figure 6E:
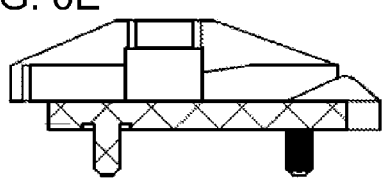
Figure 6F:
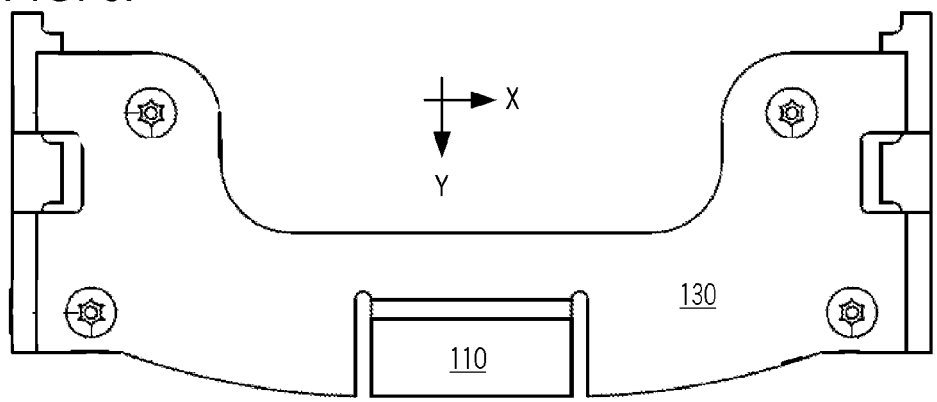
FIG. 6F illustrates, in a bottom plan view, an illustrative structure 100 in some embodiments.

Highest point 110H in some embodiments of tab 110 is located between two surfaces of tab 110 that is shaped as a wedge. Specifically, as illustrated in FIGS. 2A and 2C, tab 110 has a top surface 110T located between a ramp-up surface 110RU and a ramp-down surface 110RD. Ramp-up surface is located between proximal end 110PE and top surface 110T (including highest point 110H therein). Similarly, ramp-down surface 110RD is located between top surface 110T and distal end 110DE. Although in some embodiments, surfaces 110RD and 110RU are separated from one another by top surface 110T, in other embodiments surfaces 110RD and 110RU are not separated from one another and instead surfaces 110RD and 110RU contact each other (e.g. as illustrated in FIG. 6A) to form a line 110L (at which multiple highest points are located).

Figure 3A:
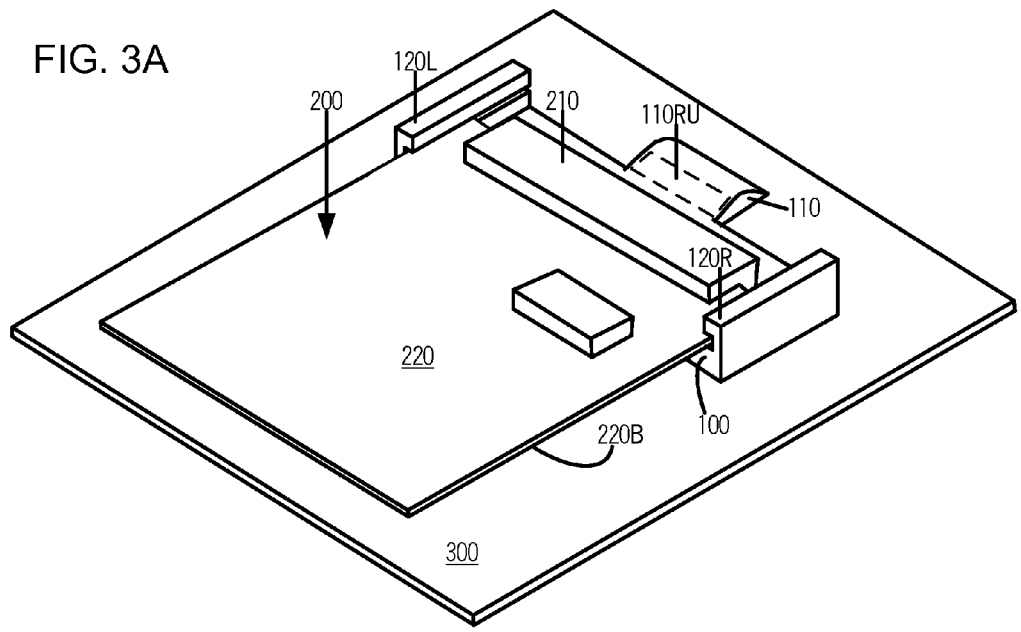
FIG. 3A illustrates, in a plan view, an assembly including structure 100 with module 200 partially inserted therein, in some illustrative embodiments in accordance with the invention.
Figure 3B:
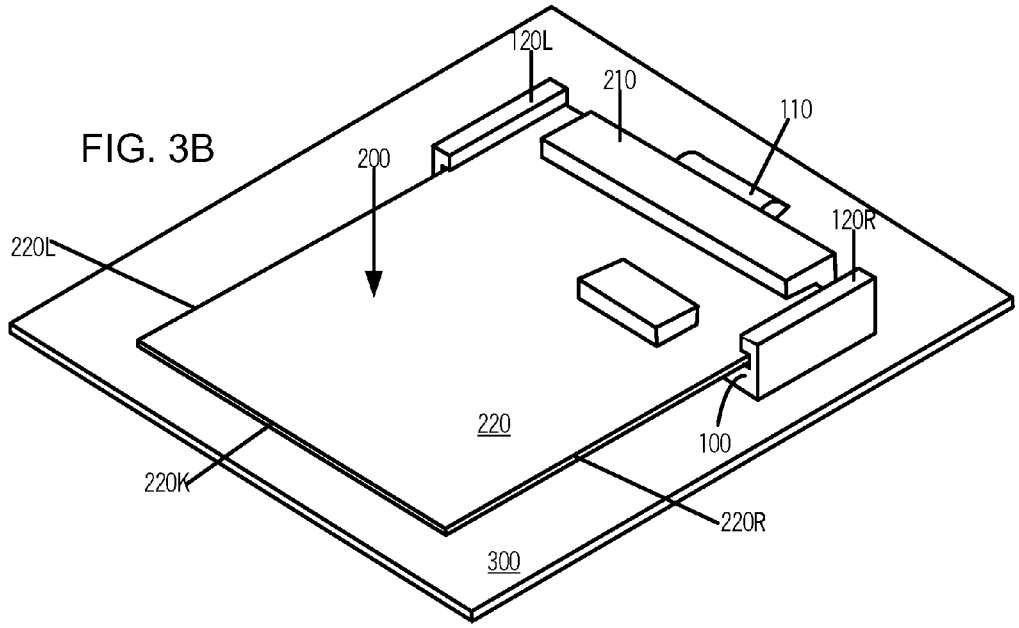
FIG. 3B illustrates, in a perspective view, the assembly of FIG. 3A with module 200 moved further along path 192 (shown in FIG. 2A).

The arrangement 299 of FIGS. 2A-2C may be used in some embodiments as illustrated in FIGS. 3A and 3B. Specifically, left and right edges of a card 220 of module 200 are initially inserted into corresponding left and right guides 120L and 120R (FIG. 3A). Subsequent to the initial insertion, card 220 is moved in the positive Y direction such that connector 210 moves towards tab 110. In the illustration shown in FIG. 3A movement of edges of card 220 is constrained by guides 120L and 120R and at this stage tab 110 is in a normal, relaxed position and located in path 192 (FIG. 2A) of connector 210.

Figure 4A:
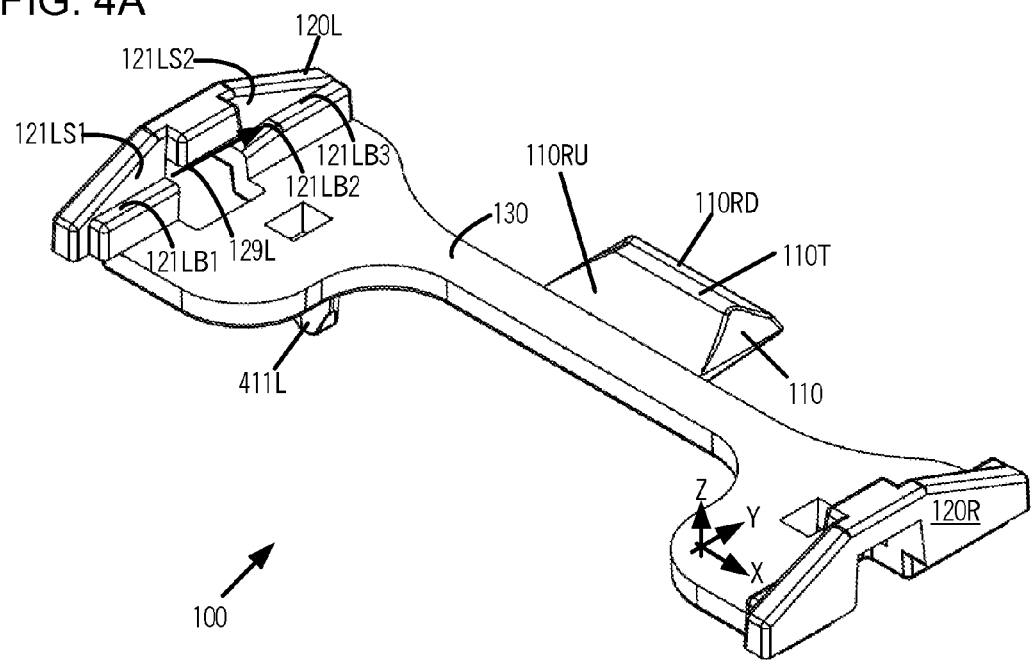
FIGS. 4A and 4B illustrate, in two perspective views, structure 100 of some illustrative embodiments in accordance with the invention.
Figure 4B:
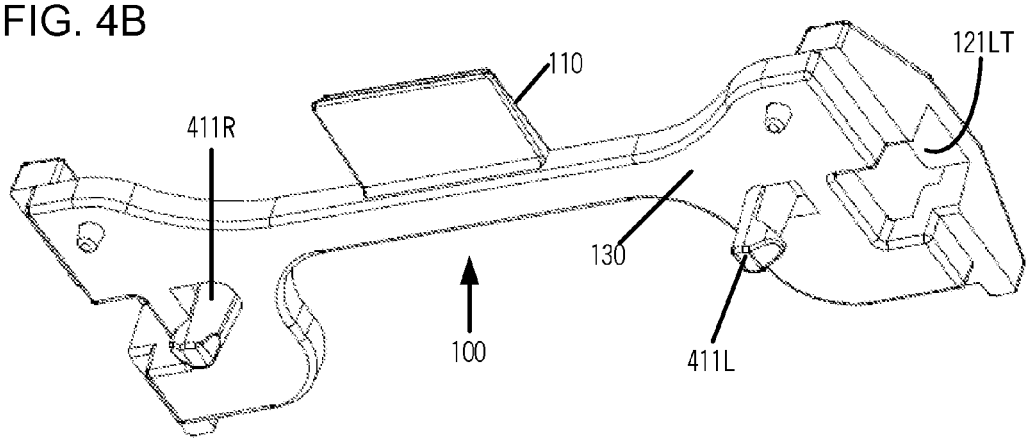
Figure 4C:
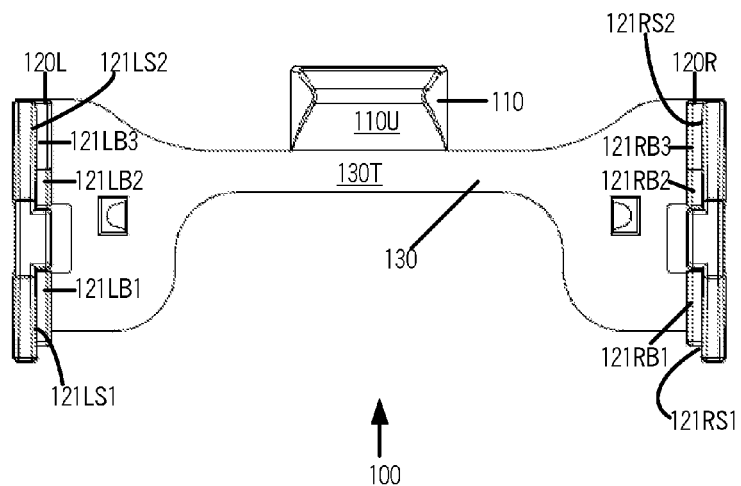
FIGS. 4C, 4D and 4E illustrates, in a top plan view, an elevation view, and a bottom plan view, the structure 100 of FIGS. 4A and 4B.
Figure 4D:
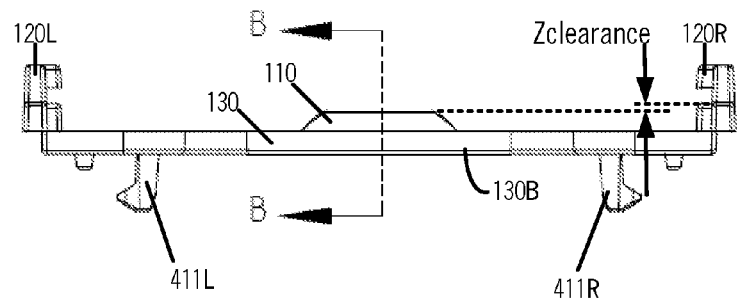
Figure 4E:
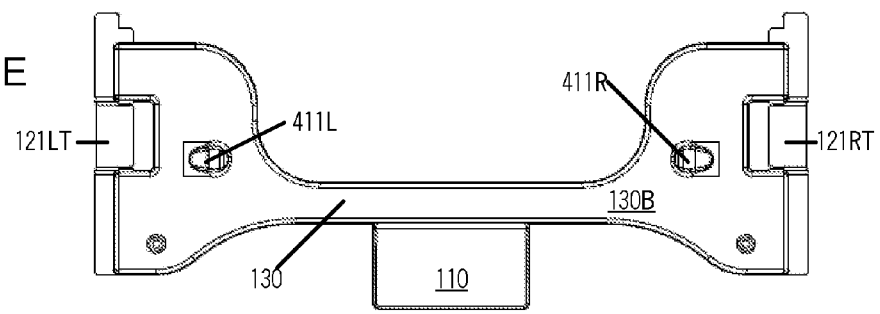
Figure 4F:
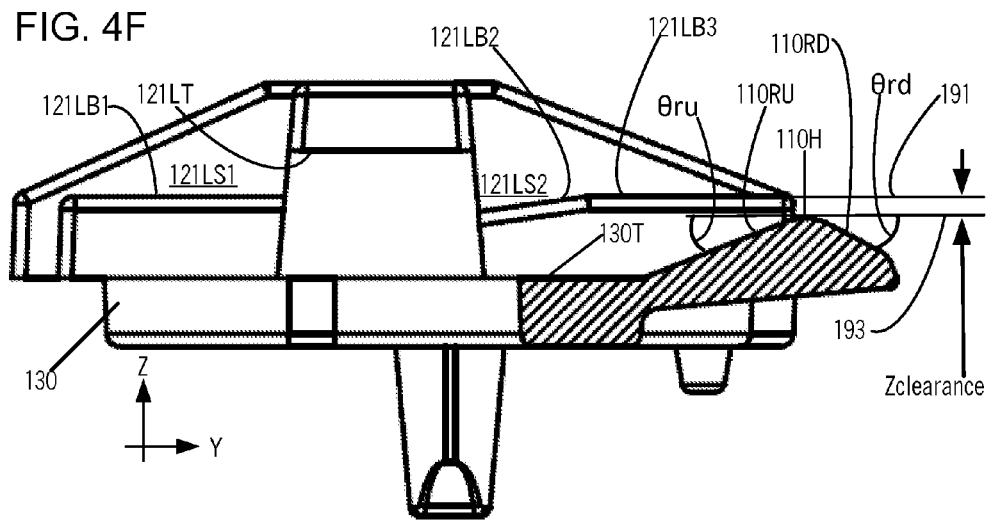
FIG. 4F illustrates, in a cross-sectional view along the direction B-B in FIG. 4D, the structure 100 of FIGS. 4A and 4B.
Figure 4I:
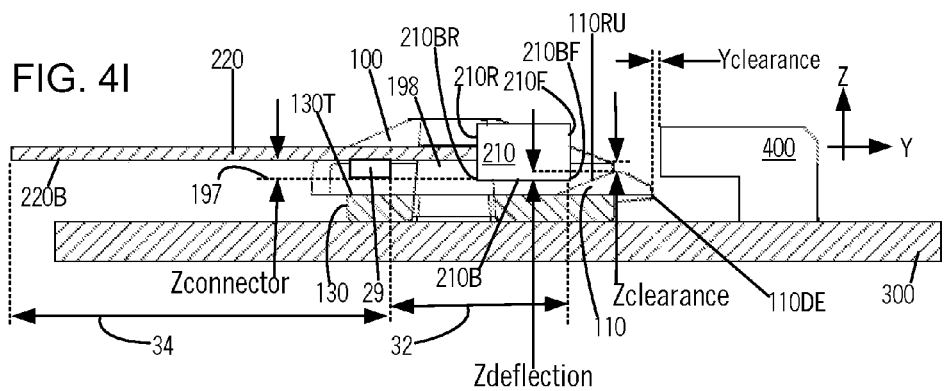
FIG. 4I illustrates, in a cross-sectional view along the direction 4I-4I in FIG. 4H, the assembly of FIG. 4G prior to mating of connector 210 with host connector 400.

As shown in FIG. 4I, a bottom surface 210B of connector 210 is located at a distance Zconnector from plane 191 which at this stage coincides with a bottom surface 220B of card 220. Bottom surface 210B is normally flat (e.g. planar and substantially parallel to plane 191) and forms a front edge 210BF with a front surface 210F of connector 210, and additionally forms a rear edge 210BR with a rear surface 21 OR of connector 210. In several embodiments, Zconnector>Zclearance, so that during initial movement along path 192 (FIGS. 2A-2C), by a user manually pushing on its back side 220K, when connector 210 reaches tab 110, a front edge 210BF of bottom surface 210B of connector 210 (see 21B in FIG. 1A) first comes in contact with ramp-up surface 110RU (FIG. 4I) of tab 110. On further movement of card 220 in the positive Y direction, front edge 210BF of connector 210 pushes down (in negative Z direction) and therefore elastically deforms tab 110 out of path 192 (FIG. 2A).

Therefore, during a movement of card 220 in the positive Y direction through arrangement 299, connector 210 moves along path 192 while in contact with tab 110, by sliding on surface 110RU in the positive Y direction so as to push surface 110RU (and a portion of tab 110) in the negative Z direction, and simultaneously left edge 220L of card 220 slides in the positive Y direction through left guide 120L and right edge 220R of card 220 slides in the positive Y direction through right guide 120R. For connector 210 to pass through a space initially occupied by tab 110 in path 192, Zconnector≤Zclearance+Zdeflection, in several embodiments wherein Zconnector>Zclearance (as noted above). Hence, in such embodiments, during further movement of card 220 in the positive Y direction through arrangement 299, connector 210 slides further in the positive Y direction on top surface 110T while simultaneously left edge 220L of card 220 slides further through left guide 120L in the positive Y direction and right edge 220R of card 220 slides further through right guide 120R in the positive Y direction.

Figure 4J:
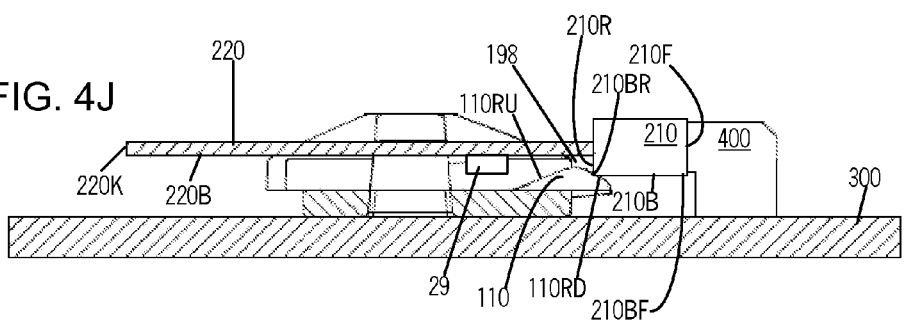
FIG. 4J illustrates, in a cross-sectional view along the direction 4J-4J in FIG. 4H, the assembly of FIG. 4H with module connector 210 and host connector 400 mated to one another.
Figure 4G:
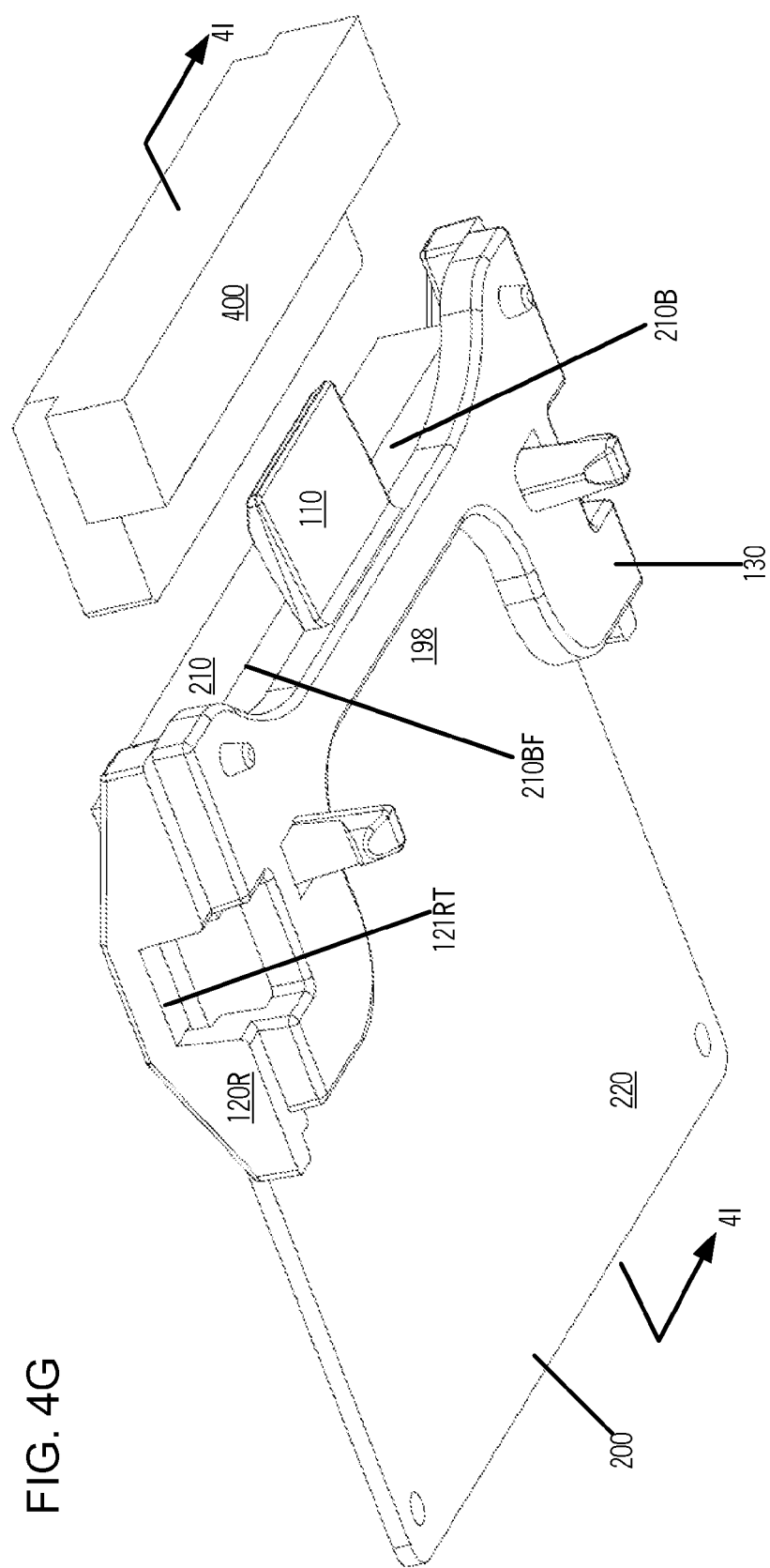
FIGS. 4G and 4H illustrate, in perspective views, an assembly including structure 100 and module 200 in an intermediate position and a final position relative to one another, an alternative embodiment in accordance with the invention.
Figure 4H:
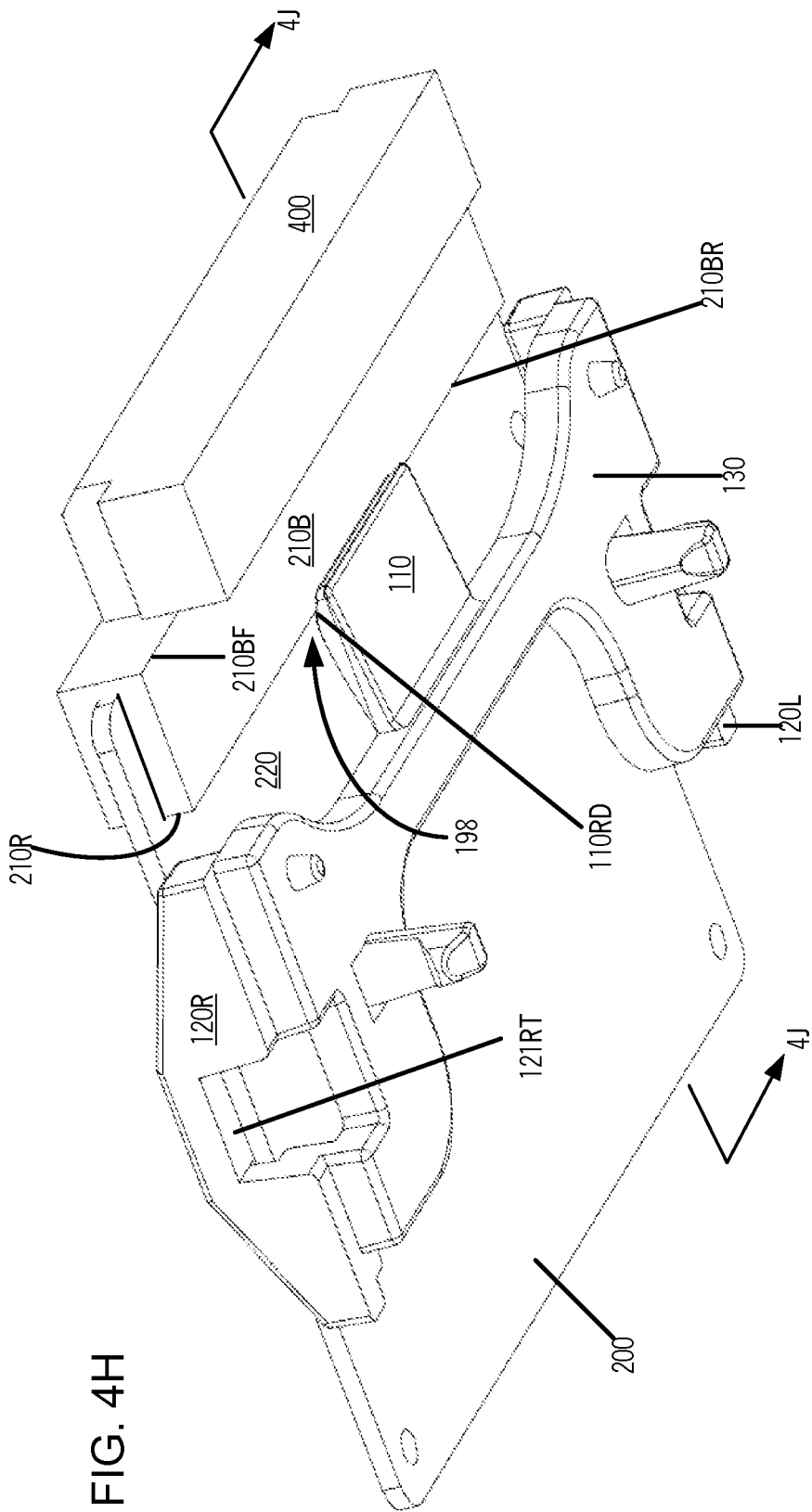

Thereafter, on still further movement of card 220 (FIG. 3B) in the positive Y direction through arrangement 299, bottom surface 210B of connector 210 slides on tab 110's top surface 110T beyond highest point 110H and hence connector 201 moves further along path 192. During the sliding movement, eventually when rear edge 210BR (see FIG. 4I) of connector 210 reaches beyond top surface 110T, deformation of tab 110 is reduced (by elasticity) which causes highest point 110H to enter at least partially into a space 198, e.g. a corner defined by rear surface 21OR of connector 210 (see FIG. 4J) and bottom surface 220B of card 220. Therefore, at this stage, ramp-down surface 110RD pushes up (in the positive Z direction) on rear edge 210BR of connector 210 and continues to do so by further entering space 198 as connector 210 reaches the end of path 192 (FIG. 2A) and mates with host connector 400 mounted on a printed circuit board 300.

In some embodiments, tab 110 is no longer elastically deformed, at the just-described stage when connectors 210 and 400 are mated to one another (i.e. top surface 110S is at its initial position relative to edges 120L and 120R), although in other embodiments a small amount of elastic deformation of tab 110 may continue to exist at this stage. Moreover, at this stage, when connectors 210 and 400 are mated to one another, in some embodiments, top surface 110T of tab 110 faces the bottom surface 220B of card 220. Note that path 192 of some embodiments is longer than each of guides 120L and 120R as illustrated in FIG. 2A, although in other embodiments either or both of guides 120L and 120R may be longer than or co-extensive with path 192 (note that path 192 extends in the Y direction up to host connector 400).

In some embodiments, tab 110 is supported either directly or indirectly on printed circuit board 300, at a distance Yclearance from host connector 400 as illustrated in FIG. 4I. Distance Yclearance (e.g. 1 mm) depends on the embodiment, and is chosen to be sufficiently large to enable the highest point 110H to reverse its movement along a path (not shown) that was taken during deformation. The just-described reverse movement occurs in a space 198, as card 220 is moved in the positive Y direction after rear edge 210BR moves past highest point 110H. Space 198 is located in a corner defined by rear surface 21 OR of connector 210 and bottom surface 220B of card 220.

More specifically, space 198 is located between bottom surface 220B of card 220 (through which passes plane 191), rear surface 210R of connector 210, a plane 197 (see FIG. 4I) that passes through bottom surface 210B of connector 210, and a component 29 (see FIGS. 4I, 4J and FIG. 1C) that is mounted on bottom surface 210B of card 220. The components of module 200 are typically of a height sufficiently small to ensure that the thickness D8 of module 200 in the component area 34 (FIG. 1B) does not exceed the thickness D6 of module 200 in the connector area 32. In some embodiments of module 200, D6=4 mm and D8=3.73 mm, and thickness D7 of card 22 is 0.9 mm. In several such embodiments, while module 200 as a whole has a specified thickness e.g. 4 mm, its connector 210 also has the same specified thickness, e.g. 4 mm also.

Figure 3C:
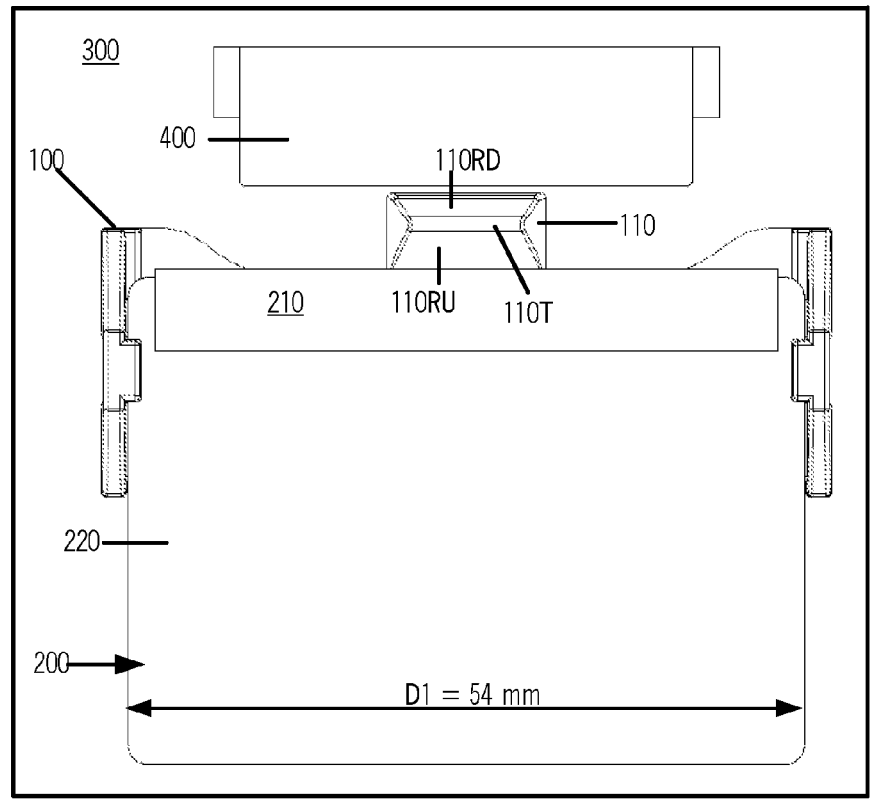
FIG. 3C illustrates, in a plan view, an assembly similar to the assembly of FIGS. 3A and 3B, with the assembly of FIG. 3C being now shown including an external connector 400 (also called "host connector") with which connector 210 mates on movement along path 192 (shown in FIG. 2A).
Figure 3D:
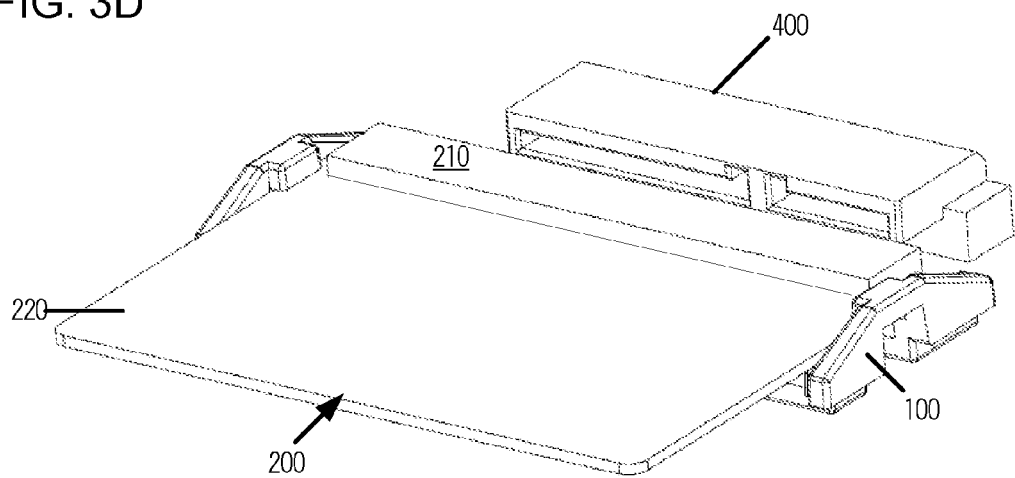
FIG. 3D illustrates, in a perspective view, the assembly of FIG. 3C.
Figure 3E:
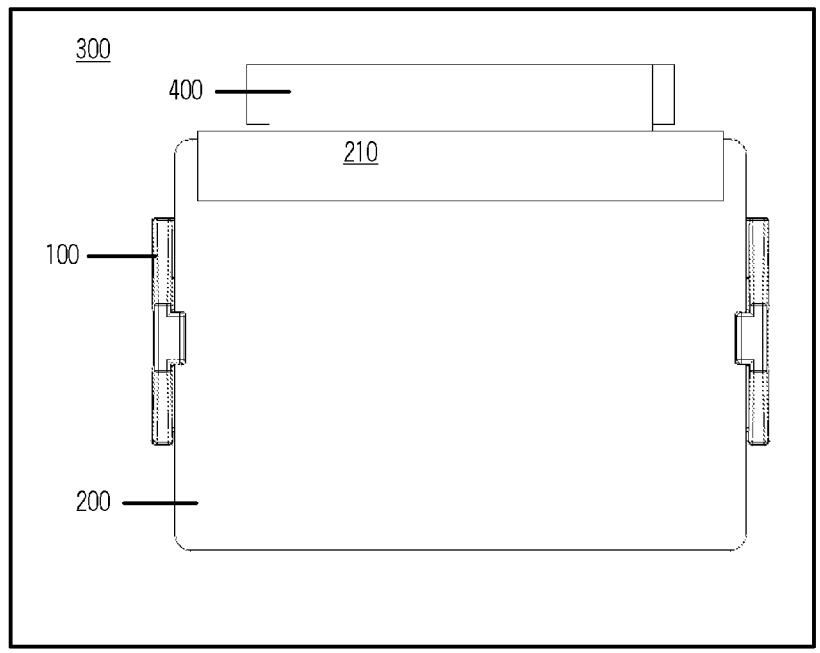
FIG. 3E illustrates, in a plan view, module 200 of FIGS. 3C and 3D on complete insertion into structure 100, in certain illustrative embodiments in accordance with the invention.
Figure 3F:
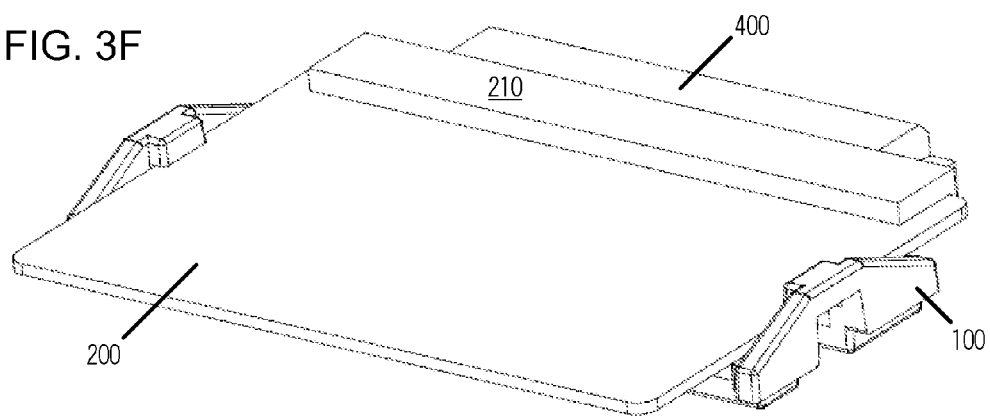
FIG. 3F illustrates, in a perspective view, the assembly of FIG. 3E.

Connector 210 (also called "module" connector 210) of module 200 is designed to mate, in a normal manner, with host connector 400, so that traces in connector 210 make surface-to-surface contact with traces in host connector 300. In some embodiments, connector 210 conforms to SATA, which is a specification entitled "Serial ATA International Organization: Serial ATA Revision 2.6" as described above. Hence, in some embodiments, a group of traces (e.g. fifteen traces) in module connector 210 and a corresponding group of traces in host connector 300 are mated to one another, to enable transfer of power and ground signals therebetween (such traces are also called "power traces", see traces 21P in FIG. 1D). Moreover, when connectors 210 and 400 are mated, a group of traces (e.g. seven traces) in module connector 210 also make surface-to-surface contact with a corresponding group of traces in host connector 300, to enable transfer of data signals therebetween (such traces are also called "data traces", see traces 21D in FIG. 1D). Presence of tab 110 in space 198 keeps connectors 210 and 400 (see FIGS. 3C, 4J) mated to one another, until module 200 is deliberately removed, by reverse movement (along path 192, see FIG. 2A).

Figure 1B:
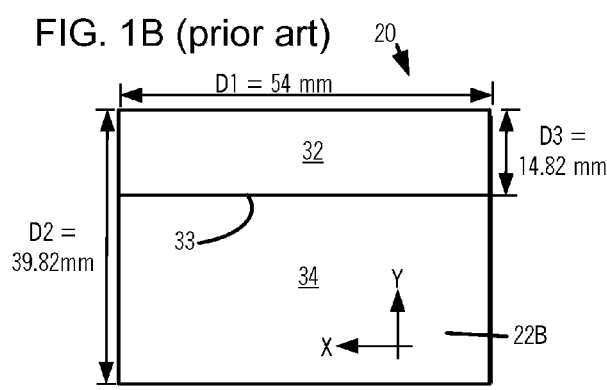
FIG. 1B illustrates, in a bottom plan view, a prior art module similar to the module illustrated in FIG. 1A.
Figure 1C:
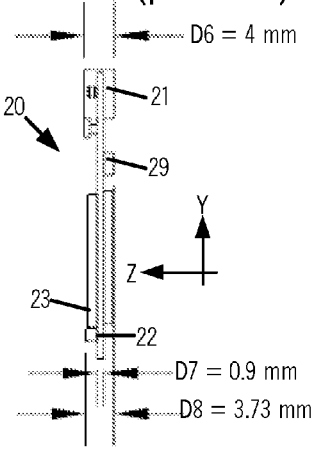
FIG. 1C illustrates, in a side view, the prior art module illustrated in FIG. 1B.
Figure 1D:
FIG. 1D illustrates, in an enlarged view, data pins 21D and power pins 21P in connector 21 of the module 20 illustrated in FIGS. 1A and 1C.

When connectors 220 and 400 are mated, a portion of tab 110 (e.g. top surface 110T on which occurs a highest point 110H) is accommodated, in some embodiments, in a space 198 that is normally unused, e.g. space that occurs at a boundary 33 between connector area 32 and component area 34 in any module 20 of the prior art (FIG. 1B). Accordingly, in some embodiments top surface 110T of tab 110 is located adjacent to boundary 33. Hence, such use of space 198 enables tab 110 to be used as described above, with any prior art module 20 that has a connector 21 mounted at front edge 22F of card 22. Also, as noted above, in several embodiments, tab 110 is physically separated from, and independent of, host connector 400, although in some embodiments both items 110 and 400 are supported on a common printed circuit board 300.

Therefore, a guides and tab arrangement 299 of the type described above in some embodiments of the invention is completely backward compatible with existing technologies, and requires no changes whatsoever to any host connector or module connector of the prior art. Guides 120L and 120R define a path 192 that provides lateral guidance during insertion and removal of a module while simultaneously a tab 110 located therebetween as described above in several embodiments retains the module in place, thereby to secure a connection between a module connector and host connector. Combination of securing a connection with lateral guidance appears to not be disclosed in U.S. Pat. No. 8,083,536, which is incorporated by reference herein in its entirety. Moreover, use of space 198 that is located at a corner of rear edge 210BR of connector 210 with bottom surface 220B of card 220, to accommodate a top surface 110T of tab 110 in certain embodiments, eliminates the need for a raised feature 80 as described in U.S. Pat. No. 8,083,536.

In some embodiments, module 200 has a width of 54 mm and thickness of 4 mm. For example, module 200 may be implemented in some embodiments to conform to the above-described Form Factor Standard "JEDEC MO-297A" which is available for download at www.jedec.org, and which is incorporated by reference herein in its entirety. In some embodiments, connector 210 of module 200 conforms to Slim SATA, while other embodiments of connector 210 may conform to other industry standards such as SCSI (Small Computer Standard Interface) or IDE (Integrated Device Electronics) as will be readily apparent in view of this detailed description.

Numerous modifications and adaptations of guides and tab arrangement 299 described above will be apparent to the skilled artisan, in view of this disclosure.

In several embodiments of the type described above, tab 110 has two ends 110DE and 110PE with a highest point 110H therebetween that deflects when pushed by a module during movement along a path between guides 120L and 120R. Although tab 110 is illustrated as a wedge in FIGS. 2A-2C, in alternative embodiments, a tab of the type described above may be implemented as a coiled spring or a cushion. In such alternative embodiments, the tab has its highest point at one end, which deflects in a manner similar to tab 110, i.e. when pushed by movement of a module wherein the edges move on pathways defined by guides 120L and 120R.

Moreover, ramp-up and ramp-down surfaces 110RD and 110RU of tab 110 are planar in some embodiments as illustrated in FIGS. 2A-2C, although in other embodiments the ramp-up and ramp-down surfaces 110RD and 110RU may be non-planar, e.g. parabolic in shape. Furthermore, in some embodiments, surfaces 110RD and 110RU are symmetric relative to another plane 193 (FIG. 4F) that passes through highest point 110H and is parallel to plane 191 (relative to which the above-described deflection is measured). In certain other embodiments, ramp-up and ramp-down surfaces 110RD and 110RU are asymmetric relative to the highest plane 193, oriented at two different angles θru and θrd respectively as illustrated in FIG. 4F.

In several embodiments, θru<θrd so that movement of a module 200 along path 192 (FIG. 2A) in the positive Y direction to deform tab 110 is easier than the reverse movement in the negative Y direction. In an illustrative example shown in FIG. 4F, ramp-up angle θru=20° which is less than ramp-down angle θrd=30°. Note that θrd may be made higher than 45° so that movement of module 200 in the negative Y direction requires more force to disassemble (relative to the force needed to assemble, by movement in the positive Y direction). An aggressive angle θrd of up to 90° may be used in some embodiments, resulting in an arrangement 299 of tab 110 relative to guides 120L and 120R that locks module 200 when module connector 210 mates with host connector 400, so that subsequent movement of module 200 in the negative Y direction is not possible without breaking (or deflecting with a finger or a lever) tab 110.

In some embodiments of the type illustrated in FIGS. 2A-2C, an arrangement 299 of tab 110 and guides 120L and 120R relative to one another is implemented as a one-piece design in a material (such as plastic) that includes a base (also called "bridge") 130. Specifically, guides 120L and 120R are physically supported on a top surface 130T of base 130 at the left edge 130L and right edge 130R respectively of base 130. In certain embodiments, tab 110 is supported on top surface 130T at a front edge 130F of base 130 that is opposite to back edge 130K (at which path 192 begins, as illustrated in FIG. 2A).

In some embodiments of the type illustrated in FIG. 2A, top surface 130T of base 130 extends between the left guide 120L and the right guide 120R, and surface 130T is substantially coplanar with the above-described plane 191. Accordingly, top surface 110T of tab 110 protrudes into a space between plane 191 and another plane (not shown) which passes through a surface 130T of the base 130. Note that in some embodiments, when module connector 210 is mated to host connector 400, top surface 11 OT of tab 110 protrudes into space 198 between plane 191 and another plane (not shown) which passes through bottom surface 210B of connector 210 and simultaneously ramp-down surface 110RD of tab 110 is in contact with (and pushes on) an edge 210BR of connector 210 formed by bottom surface 210B and rear surface 21 OR that faces a component (such as component 23 or 29) mounted on the bottom surface 220B of card 220.

Figure 5A:
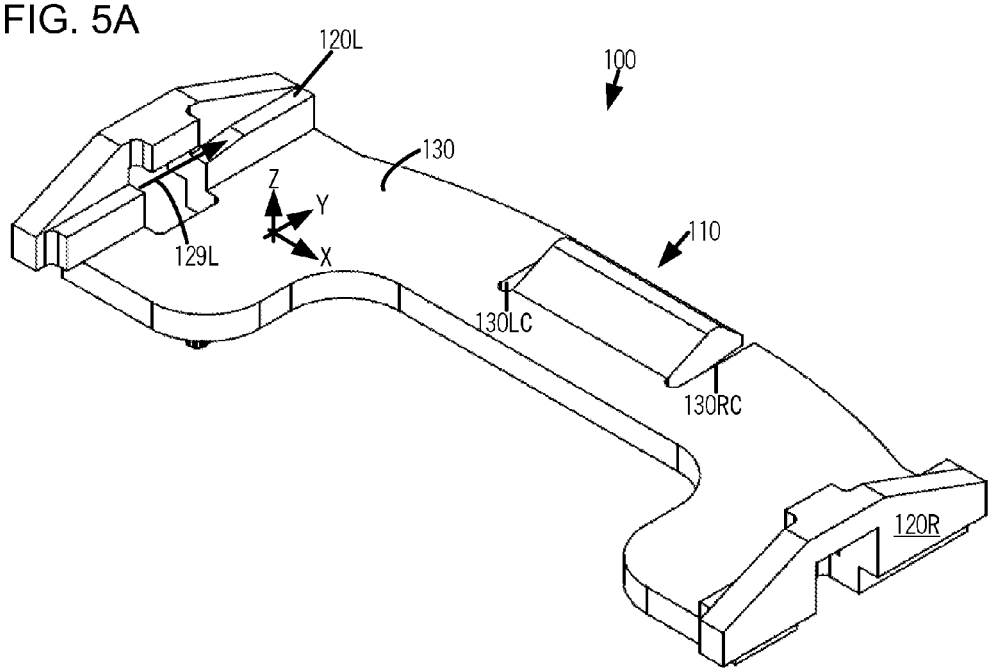
FIGS. 5A and 5B illustrate, in two perspective views, structure 100 of some illustrative embodiments in accordance with the invention.
Figure 5B:
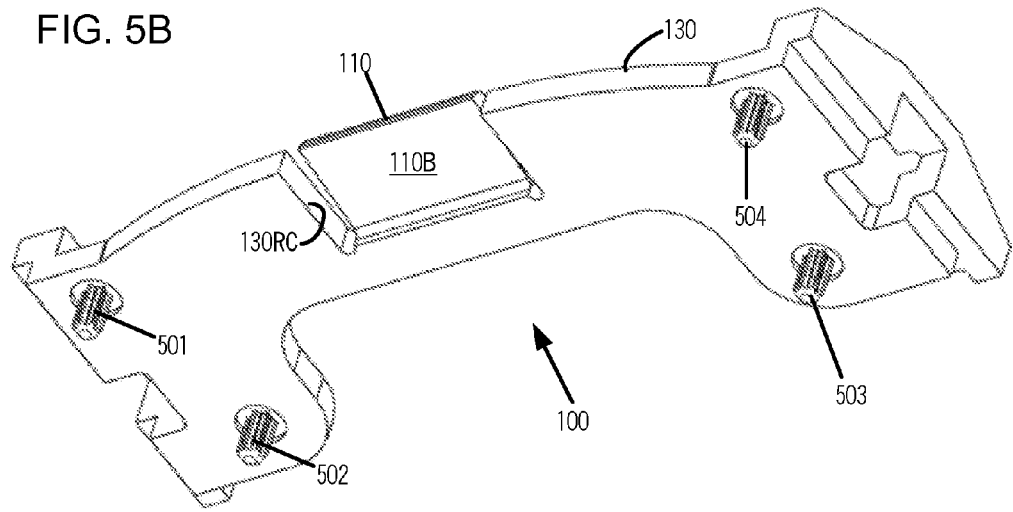

Opposite to top surface 130T, base 130 has a bottom surface 130B at which may be located one or more fasteners (not shown in FIGS. 2A-2C), such as hooks 411L and 411R illustrated in FIGS. 4D and 4E, or press-fit pegs 501-504 illustrated in FIG. 5B. The just-described fasteners are used to mount base 130 to a printed circuit board 300. Base 130 of FIG. 2A is shown as a rectangular block in some embodiments, although base 130 may have other shapes in other embodiments, as illustrated in FIGS. 4A-4H, 5A, 5B, and 6A-6E.

Figure 7A:
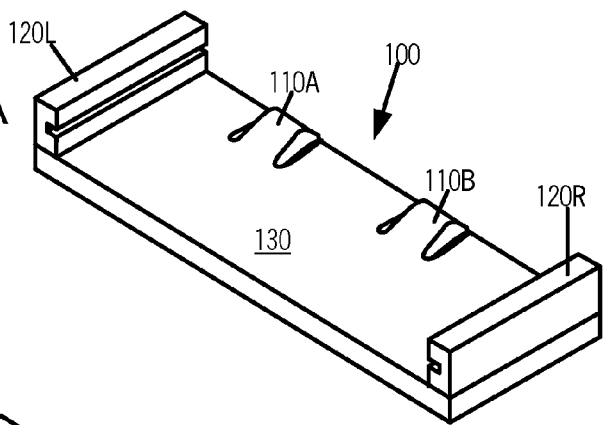
FIGS. 7A-7D illustrate, in perspective views, alternative arrangements in some embodiments.
Figure 7B:
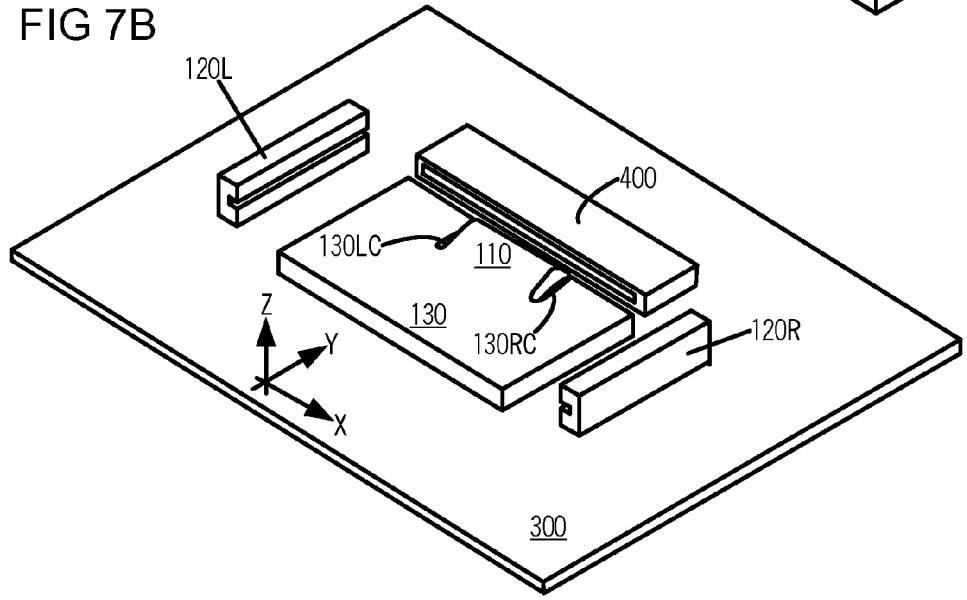

Depending on the embodiment, tab 110 can be formed as a part that is separate from guides 120L and 120R, i.e. three separate parts that are arranged relative to one another to form an arrangement 299 of the type described above, as illustrated in FIGS. 7B-D. In the embodiment illustrated in FIG. 7B, base 130 is co-extensive with tab 110 in the positive Y direction, with tab 110 being formed by two cuts 130LC and 130RC in base 130 and bending the portion 110 located between these two cuts. Although only two cuts are shown in FIG. 7B, four cuts may be used as illustrated in FIG. 7A to form two tabs 110A and 110B, both located between guides 120L and 120R. Accordingly, an arrangement 299 of the type described above is not limited to using a single tab between two guides, and hence may include multiple tabs therebetween.

Figure 7C:
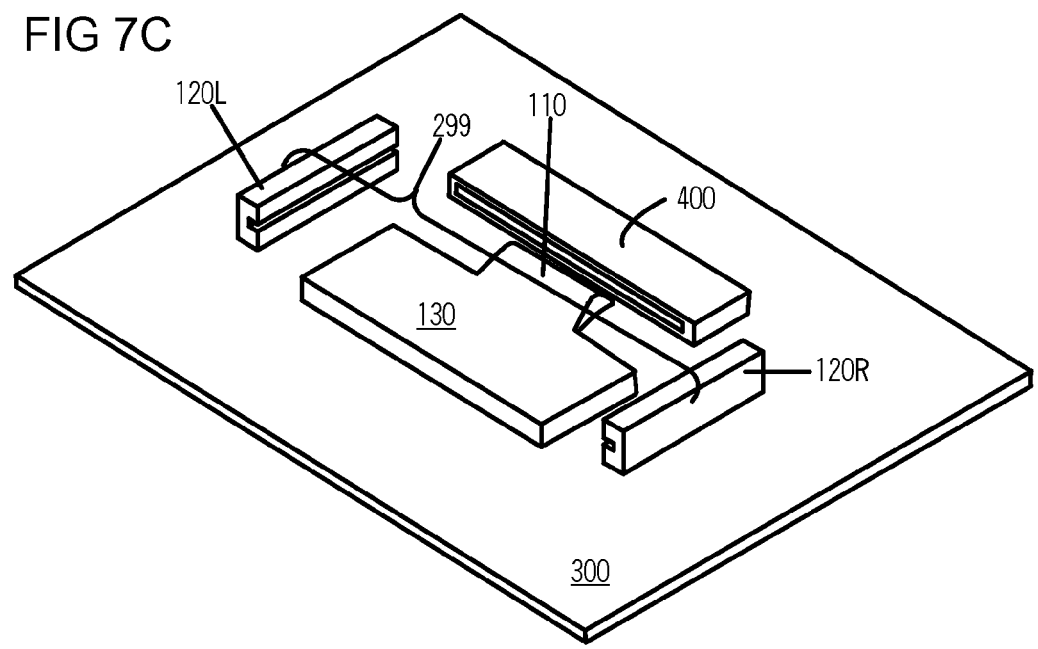

Moreover, FIG. 7C illustrates an arrangement 299 in some embodiments, wherein tab 110 and base 130 are implemented in plastic, as a single piece that is separate from guides 120L and 120R, all of which are mounted on a printed circuit board 300 on which is also mounted a host connector 400. In other embodiments, guides 120L and 120R may be mounted on two walls 702L and 702R of a chassis (such as a telecom chassis), with tab 110 being mounted on a printed circuit board or another wall 701 of the chassis.

Figure 7D:
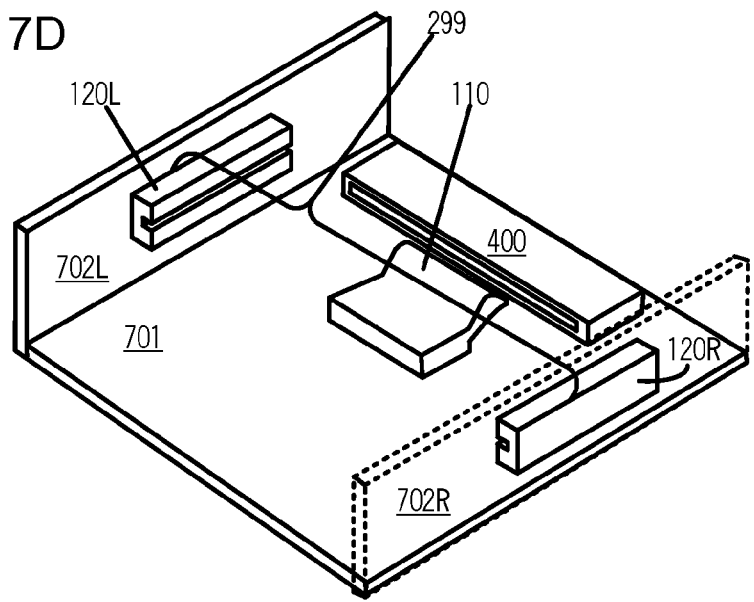

Furthermore, although tab 110 is shown as being integral with base 130 in some embodiments, in other embodiments (not shown) tab 110 is bonded to base 130 which could then be made of a thin spring steel (either a sheet tab or wire). In some embodiments wherein tab 110 is made as a separate part, the remainder of an arrangement 299 of the type described above could be made of metal (aluminum, steel, etc) or any other material, as a single piece. In still other embodiments, such an arrangement 299 may omit base 130 entirely, and make three separate parts: left guide 120L, right guide 120R, and tab 110, as illustrated in FIG. 7D. Embodiments realized in plastic as a single-piece design are believed to result in a cost-effective design, and lighter weight than various multiple piece embodiments described above.

Although in some embodiments, each of guides 120L and 120R has three surfaces that are co-extensive with one another as illustrated in FIGS. 2A-2C, in other embodiments such surfaces need not be co-extensive. For example, FIG. 4A illustrates a left guide 120L including two left side surfaces 121LS1 and 121LS2 that are coplanar with one another, two left bottom surfaces 121LB1 and 121LB3 that are coplanar with one another and with plane 191 (FIG. 2A), and one left top surface 121LT (FIG. 4B). A plane passing through left top surface 121LT is spaced apart by the distance Zpassage (see FIG. 2B) from plane 191 that passes through left bottom surfaces 121LB1 and 121LB3. Left top surface 121LT is located between left bottom surface 121LB1 and a middle left bottom surface 121LB2 that is inclined relative to and forms an edge with the above-described left bottom surface 121LB3. A similar set of surfaces are included in right guide 120R of structure 100 that implements an arrangement 299 of the type described above. Specifically, structure 100 includes a base 130 that interconnects various parts of arrangement 299, such as guides 120L and 120R and tab 110 as shown in FIG. 4A. An angle of inclination of middle left bottom surface 121LB2 is designed to provide room to allow module 200 to be pivoted during insertion into structure 100 of FIG. 4A.

Certain illustrative dimensions of some embodiments are as follows, although specific dimensions can be different depending on the embodiment. FIG. 1A: Zcard (e.g. 0.9 mm), Xcard (e.g. 54 mm), Zconnector (e.g. 4 mm or 0.022 in). FIG. 1B: D10 (e.g. 2.5 mm) between connector 21 and component 23, is sufficiently large to define a space into which highest point 110H of tab 110 returns back when the two connectors 210 and 400 (see FIGS. 3C, 4J) mated to one another. FIG. 2A: Xpassage (e.g. 56 mm)=Xcard+Xclearance. FIG. 2B: Zpassage (e.g. 1.27 mm or 0.050 inch), Zseparation (e.g. 2.26 mm or 0.089 inch) is the distance between bottom surface 121 LB of guide 120L and top surface 130T of base 130, Zprotrusion (e.g. 0.065 in or 1.651 mm) is the distance of highest point 110H from top surface 130T of base 130, and Zclearance (e.g. 0.61 mm or 0.024 inch). FIG. 2C: Zdeflection (e.g. 0.022 inch or 0.5588 mm). Although specific values of dimensions have been provided as illustrative examples, other dimensions will be readily apparent to a skilled artisan in view of this detailed description.

Note that Zseparation depends on the design since a constraint in several embodiments is imposed between connector 220 and tab 110. In some embodiments, the width of tab 110 (along the X direction) is less than the width of connector 220 by one or more orders of magnitude, and may be selected based on the position of one or more electronic components on module 200. For example, for a module 200 that conforms to Slim SATA, the width of tab 110 may be selected to be 0.475 inch. The length of tab 110 (along the Y direction, between distal end 110DE and proximal end 110PE) can vary depending on the amount of spring force is required to retain module 200 when connector 220 is mated to connector 400, while still allowing module 200 to slide in and out of place during assembly/disassembly.

Although certain arrangements and structures have been described above, other structures and arrangements would be readily apparent to the skilled artisan, in view of this detailed description. For example, although in some embodiments a left guide 120L constrains movement of left edge 22L of a card 22 to a left passageway and a right guide 120R constrains movement of right edge 22R of card 22 to a right passageway, other embodiments use means for constraining movement of the left edge of a card and means for constraining movement of the right edge of the card. And, although in some embodiments tab 110 is used as the means to retain connector 21 of card 22 relative to guides 120L and 120R, other embodiments use other means located between the two means described in the previous sentence, for retaining a connector mounted at a front edge of the card. Depending on the embodiment, the just-described means for retaining may be made reciprocable (e.g. move in a reciprocating manner) out of and into a path of the connector through a space located between the two means (described in this paragraph) that constrain movement.

In many embodiments, a single tab 110 is sufficient to retain connector 21 of card 22 in combination with guides 120L and 120R, because guides 120L and 120R interoperate with tab 110 to constrain movement of card 22 (with connector 21) to only a path therebetween, to/from an external connector (e.g. 400). Hence, a combination of two guides with a single tab in several embodiments eliminates the need to use two clips as described by U.S. Pat. No. 8,083,536.

Therefore, numerous such embodiments will be apparent in view of this detailed description. Numerous modifications and adaptations of the embodiments described herein are encompassed by the scope of the invention.

What is claimed is:

1. An assembly comprising:
   a base comprising a left edge and a right edge spaced opposite to one another;
   a left guide and a right guide supported on the base at the left edge and the right edge respectively;
   a module comprising a connector at a front edge thereof, the module comprising a card having a left edge disposed in a left passageway defined by the left guide, the card having a right edge disposed in a right passageway defined by the right guide, the module further comprising an electronic component mounted on the card between the connector and a back edge of the card; and
   a tab supported by the base, a portion of the tab protruding into a space between a bottom surface of the card and a plane passing through a bottom surface of the connector;
   wherein a surface of the tab is in contact with an edge of the connector formed by the bottom surface of the connector and a rear surface of the connector, wherein the rear surface of the connector faces the electronic component on the card.

2. The assembly of claim 1 wherein:
   said module has thickness of 4 mm; and
   said connector has thickness of 4 mm.

3. The assembly of claim 1 wherein:
   the connector comprises a first group of traces physically spaced apart from a second group of traces.

4. The assembly of claim 1 wherein:
   the portion of the tab faces the bottom surface of the card.

5. The assembly of claim 1 wherein:
   the portion of the tab is located adjacent to a boundary between a connector area of the module that comprises the connector and a component area of the module that comprises the electronic component.

6. The assembly of claim 1 wherein:
   said surface is a ramp down surface; and
   the portion comprises a top surface, the top surface being located between the ramp down surface and a ramp up surface of the tab.

7. The assembly of claim 6 wherein:
   the ramp down surface is located between a distal end of the tab and the ramp up surface; and the tab is elastically deformable such that the distal end moves through distance Zmax>Zdeflection through which moves a highest point on the top surface.

8. The assembly of claim 1 wherein:
said surface is a ramp down surface;
a ramp up surface of the tab contacts the ramp down surface of the tab, to form a line.

9. The assembly of claim 8 wherein:
the tab is elastically deformable such that a distal end thereof moves through a distance Zmax>Zdeflection through which moves at least one highest point on said line.

10. The assembly of claim 1 wherein:
the left guide comprises a first plurality of surfaces configured to define a first "U" shaped channel; and
the right guide comprises a second plurality of surfaces configured to define a second "U" shaped channel.

11. The assembly of claim 1 wherein:
the base comprises another surface extending between the left guide and the right guide;
the tab is supported on said another surface; and
each of the base, the guides and the tab are formed as integral portions of a single piece of material.

12. The assembly of claim 1 wherein said connector is hereinafter a first connector, the assembly further comprising:
a second connector mounted on a printed circuit board;
wherein the first connector is mated with the second connector.

13. The assembly of claim 12 wherein:
the card is constrained to move only in a path between the left guide and the right guide, to/from the second connector.

14. The assembly of claim 1 wherein:
said surface is a ramp down surface;
the tab comprises a distal end located farthest from the left guide and the right guide;
the ramp down surface is located between the distal end and said portion; and
the tab comprises a ramp up surface located between said portion and a proximal end of the tab closest to the left guide and the right guide.

15. The assembly of claim 14 wherein:
the tab is elastically deformable such that the distal end moves and the proximal end does not move.

16. The assembly of claim 1 wherein, said plane is hereinafter a first plane, and wherein:
the tab is located between the left guide and the right guide, the tab comprising a highest point located at a first distance Zclearance measured from a second plane extending between the left guide and the right guide;
wherein the top surface of the tab is elastically deformable in a direction transverse to said second plane, from said first distance Zclearance, to a second distance Zclearance+Zdeflection measured from said second plane extending between the left guide and the right guide.

17. The assembly of claim 16 wherein:
the base comprises a surface extending between the left guide and the right guide; and
the surface of the base is substantially coplanar with said second plane.

* * * * *